US010665936B2

(12) United States Patent
Mikata et al.

(10) Patent No.: US 10,665,936 B2
(45) Date of Patent: May 26, 2020

(54) WIRELESS MODULE AND METHOD FOR MANUFACTURING WIRELESS MODULE

(71) Applicant: TAIYO YUDEN CO., LTD., Tokyo (JP)

(72) Inventors: Jin Mikata, Tokyo (JP); Masaya Shimamura, Tokyo (JP); Mikio Aoki, Tokyo (JP); Takehiko Kai, Tokyo (JP); Taiji Ito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/828,191

(22) Filed: Nov. 30, 2017

(65) Prior Publication Data

US 2018/0159217 A1    Jun. 7, 2018

(30) Foreign Application Priority Data

Dec. 1, 2016   (JP) ................. 2016-233912

(51) Int. Cl.
*H01Q 1/52*    (2006.01)
*H01Q 1/38*    (2006.01)
(Continued)

(52) U.S. Cl.
CPC .......... *H01Q 1/526* (2013.01); *H01L 23/552* (2013.01); *H01L 23/66* (2013.01); *H01Q 1/2283* (2013.01); *H01Q 1/38* (2013.01); *H01L 23/3121* (2013.01); *H01L 2223/6677* (2013.01); *H01L 2224/16225* (2013.01); *H01L 2224/97* (2013.01); *H01L 2924/1815* (2013.01); *H01L 2924/3025* (2013.01)

(58) Field of Classification Search
CPC ........ H01Q 1/38; H01Q 1/2283; H01Q 1/526; H01L 23/3121; H01L 21/563; H01L 23/552; H01L 23/66; H01L 2924/3025; H01L 2924/1815; H01L 2224/97; H01L 2224/16225; H01L 2223/6677
See application file for complete search history.

(56) References Cited

U.S. PATENT DOCUMENTS 6,818,985 B1 * 11/2004 Coccioli ............. H01L 23/3128
257/240
7,342,299 B2 * 3/2008 Gaucher ................ H01Q 23/00
257/674
(Continued)

FOREIGN PATENT DOCUMENTS

JP        2004165531 A   *   6/2004

*Primary Examiner* — Ab Salam Alkassim, Jr.
(74) *Attorney, Agent, or Firm* — Chen Yoshimura LLP (57) ABSTRACT

A wireless module, including: a substrate; an electronic circuit mounted in a first region on a one face of the substrate; a conductive pattern formed in a second region on another face of the substrate, the conductive pattern being connected to a radio communication section of the electronic circuit, and the conductive pattern serving as an antenna when transmitting/receiving radio wave, the second region being different from the first region; a resin layer sealing the electronic circuit in the first region; a shielding layer formed on a surface of the resin layer; and a shield disposed in either one of a top layer of the substrate and an inner layer of the substrate, the shield being for shielding noise radiated from the electronic circuit.

11 Claims, 9 Drawing Sheets

(51) Int. Cl.
 *H01L 23/552* (2006.01)
 *H01L 23/66* (2006.01)
 *H01Q 1/22* (2006.01)
 *H01L 23/31* (2006.01)

(56) References Cited

U.S. PATENT DOCUMENTS

| | | | | |
|---|---|---|---|---|
| 8,874,048 B2* | 10/2014 | Tsutsumi | H01Q 29/00 | 455/106 |
| 9,881,882 B2* | 1/2018 | Hsu | H01L 23/3128 | |
| 9,887,454 B2* | 2/2018 | Ito | H01Q 223/00 | |
| 10,163,867 B2* | 12/2018 | Kim | H01L 23/552 | |
| 10,283,859 B2* | 5/2019 | Nguyen | H01L 21/027 | |
| 2008/0210462 A1* | 9/2008 | Kawagishi | H01L 21/561 | 174/377 |
| 2010/0103058 A1* | 4/2010 | Kato | H01Q 1/44 | 343/702 |
| 2010/0207257 A1* | 8/2010 | Lee | B81B 7/0061 | 257/660 |
| 2010/0246143 A1* | 9/2010 | Dinh | H05K 9/0026 | 361/748 |
| 2012/0320558 A1* | 12/2012 | Foster | H05K 1/0218 | 361/818 |
| 2013/0093629 A1* | 4/2013 | Chiu | H01Q 1/243 | 343/700 MS |
| 2013/0222196 A1* | 8/2013 | Hashimoto | H01Q 13/10 | 343/767 |
| 2013/0225102 A1* | 8/2013 | Tsutsumi | H01L 23/552 | 455/90.2 |
| 2013/0301227 A1* | 11/2013 | Kawano | H01L 21/561 | 361/748 |
| 2014/0239464 A1* | 8/2014 | Chung | H01L 23/60 | 257/659 |
| 2015/0131231 A1* | 5/2015 | Yoo | H05K 3/4007 | 361/707 |
| 2016/0149300 A1* | 5/2016 | Ito | H01Q 23/00 | |
| 2017/0141081 A1* | 5/2017 | Lee | H01L 25/0657 | |
| 2017/0301986 A1* | 10/2017 | Nguyen | H01L 21/268 | |
| 2017/0354039 A1* | 12/2017 | Miwa | H01L 24/97 | |
| 2018/0159216 A1* | 6/2018 | Kai | H01Q 9/42 | |
| 2018/0166767 A1* | 6/2018 | Ito | H01L 25/00 | |
| 2018/0286817 A1* | 10/2018 | Kitazaki | H01L 21/56 | |
| 2019/0372210 A1* | 12/2019 | Mikata | H01Q 1/38 | |

* cited by examiner

WIRELESS MODULE AND METHOD FOR MANUFACTURING WIRELESS MODULE

CROSS-REFERENCE TO RELATED APPLICATIONS

The present application claims priority upon Japanese Patent Application No. 2016-233912 filed on Dec. 1, 2016 which is herein incorporated by reference.

BACKGROUND

Technical Field

This disclosure relates to a wireless module and a method for manufacturing a wireless module.

Related Art

These days, various electronic devices, i.e., wearable devices, comprise ultra-small wireless modules, each of which is configured such that an electronic circuit and an antenna capable of transmitting or receiving radio wave are mounted on a single substrate.

In such a wireless module, in order to minimize leakage of noise caused by the electronic circuit, such a technique has been developed that the electronic circuit on the substrate is sealed with resin and the surface of the resin is covered with a metal layer.

In such a wireless module, an electronic circuit and an antenna are sealed by forming a resin layer on the entirety of a substrate, and thereafter grooves are formed in resin between the electronic circuit and the antenna. Subsequently, a metal layer is formed inside the grooves as well as on the surface of the resin layer. Thus, noise from the electronic circuit does not affect the antenna.

However, in this case, if the depths of the grooves formed in resin is smaller than the thickness of the resin layer, a part which is not a metal layer remains between the substrate and the bottom of the metal layer formed in these grooves. This decreases an effect that noise is shielded.

On the contrary, if the depths of the grooves formed in resin is larger than the thickness of the resin layer, this increases an effect that noise is shielded because the bottom of the metal layer reaches inside the substrate. However, since it is also necessary to form the grooves in the substrate, the strength of the substrate decreases.

Since the antenna and the electronic circuit are sealed together, sealing of the antenna has a thickness to cover tall electronic components of the electronic circuit. Consequently, most parts around the antenna are resin since the antenna is composed of thin conductive pattern. This causes significant difference in amount of resin between on the electronic circuit and on the antenna, this leads to cambers the substrate.

SUMMARY

A wireless module of this disclosure, including:
  a substrate;
  an electronic circuit mounted in a first region on a one face of the substrate;
  a conductive pattern formed in a second region on another face of the substrate,
    the conductive pattern being connected to a radio communication section of the electronic circuit, and
    the conductive pattern serving as an antenna when transmitting/receiving radio wave,
    the second region being different from the first region;
  a resin layer sealing the electronic circuit in the first region;
  a shielding layer formed on a surface of the resin layer; and
  a shield disposed in either one of a top layer of the substrate and an inner layer of the substrate,
    the shield being for shielding noise radiated from the electronic circuit.

DETAILED DESCRIPTION

Appropriately with reference to the drawings, a wireless module and a method for manufacturing a wireless module according to the embodiment of this disclosure will be described below. In the drawings, the same components are denoted by the same reference numerals. As used herein, the singular forms "a", "an", and "the" are intended to include the plural forms as well, unless the context clearly indicates otherwise.

First Embodiment

Wireless Module

Figure 1:
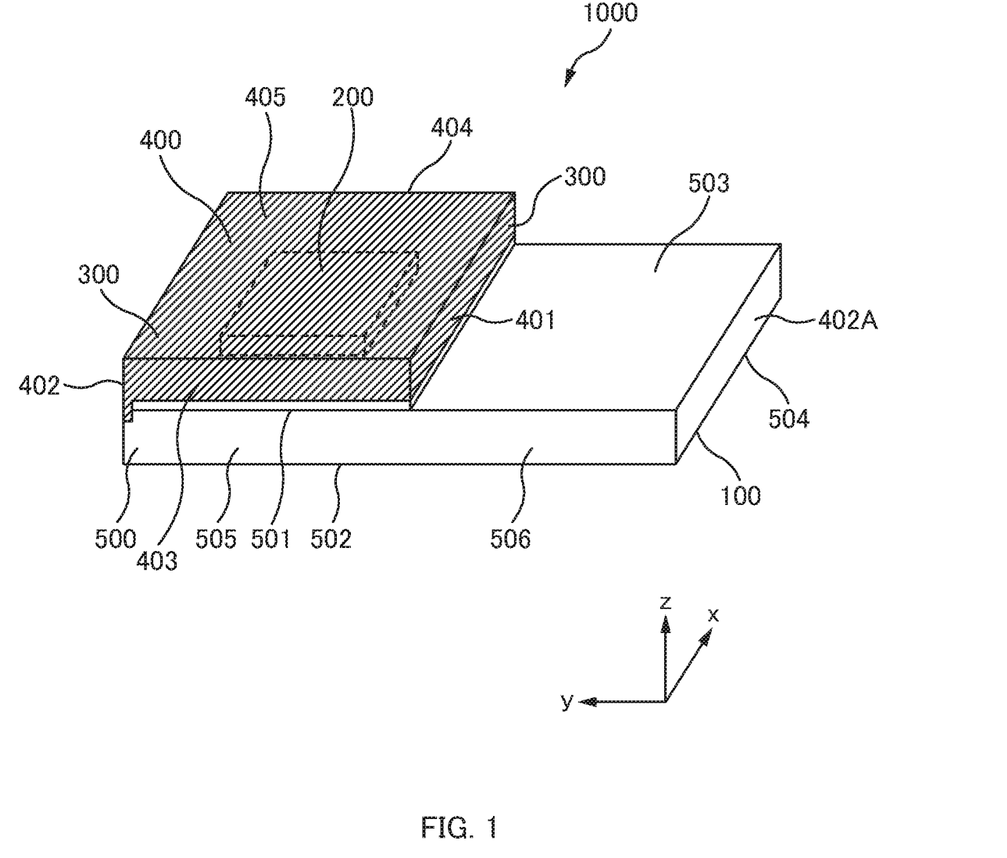
FIG. 1 is an external perspective view of a wireless module according to an embodiment of the present disclosure.
Figure 2:
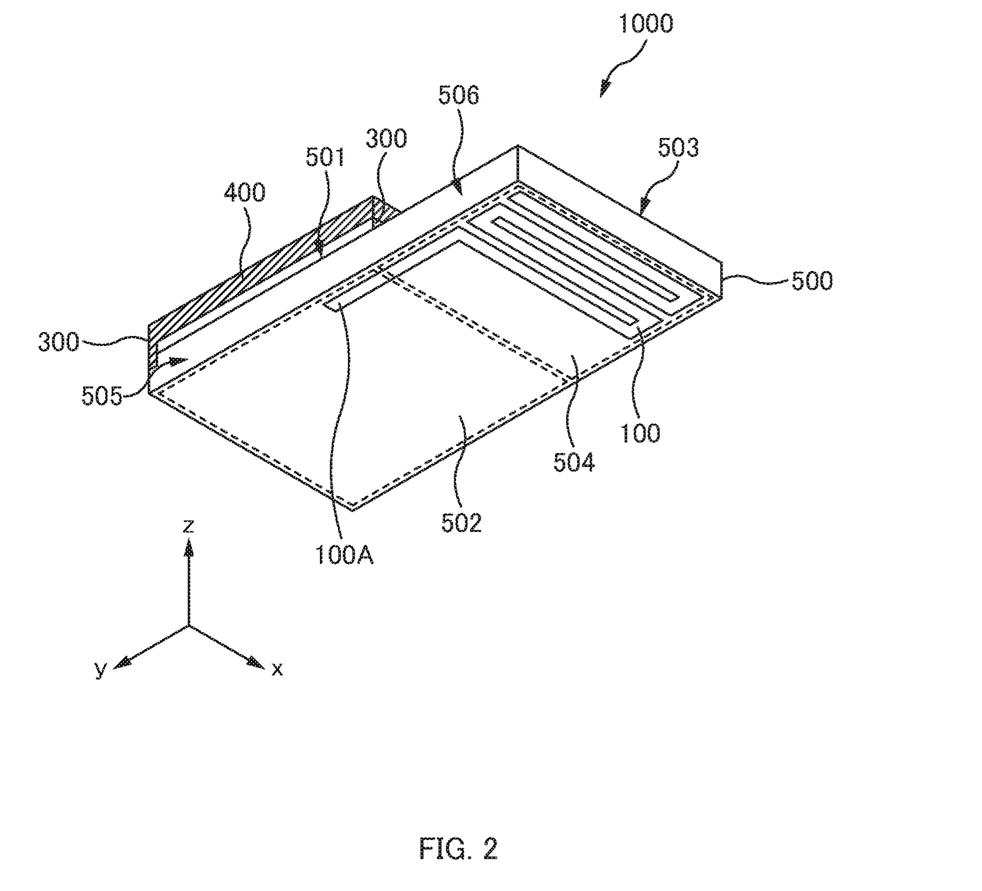
FIG. 2 is an external perspective view of a wireless module according to an embodiment of the present disclosure.

FIGS. 1, 2, 3A to 3E show a wireless module 1000 according to an embodiment of the present disclosure. FIGS. 1 and 2 are external perspective views of the wireless module 1000, and FIGS. 3A to 3E are a cross-sectional view of the wireless module 1000.

In this embodiment, the x-axis direction, the y-axis direction and the z-axis direction are defined as follows. The z-axis direction (hereinafter referred to as the z direction) is defined running in the vertical direction, and the y-axis direction (hereinafter referred to as the y direction) is defined in a direction in which a first circuit region 501 and a first antenna region 503 are arranged in line on a surface of a substrate 500 (the one face; to be described later) as viewed the wireless module 1000 from above. The x-axis direction (hereinafter referred to as the x direction) is defined in a direction that is orthogonal to both the y-axis direction and the z-axis direction.

The wireless module 1000 includes the substrate 500, an electronic circuit 200, an antenna 100, a resin layer 300 and a shielding layer 400

The substrate 500 is a hexahedron having a front surface, a back surface and four side surfaces, and is in a rectangular shape as viewed from above, as shown in FIG. 1. The thickness of the substrate 500 is equal to or less than 1 mm, for example approximately 0.3 mm.

The substrate 500 is made of insulating resin, a semiconductor material (ceramic or Si), and is a so-called interposer. Conductive patterns on the substrate 500 are insulated with such insulating material or such semiconductor material (or an oxide thereof) and are arranged. As an example of the substrate 500, provided is a printed circuit board 500. A first type of printed circuit board 500 is one in which conductive patterns and insulating resin layers are laminated on both surfaces of a core layer made of insulating resin. A second type of printed circuit board 500 is one in which insulating resin layers and conductive patterns are laminated from the bottom surface to above; there is no core layer. Some of the first type includes printed circuit boards whose core layer is a metal core. These are generally referred to as multi-layer printed circuit boards, and are employed in various modules.

The printed circuit board 500 has a first region and a second region. The first region and the second region may be adjacent, or there may be a space therebetween.

On the top side of the first region, a conductive pattern is formed and electronic components are placed; this region is referred to as the first circuit region 501. On the back surface in the first region, an external electrode for mounting a solder ball is provided; this region is referred to as the second circuit region 502. The top side of the second region is referred to as the first antenna region 503, and the back side of the second region is referred to as the second antenna region 504. A conductive pattern serving as the antenna 100 is provided on either one of the top side and the back side. In FIGS. 1 and 2, the antenna 100 is provided in the second antenna region 504, that is on the back side.

The electronic circuit 200 is composed of various electronic components (not shown) such as an IC (Integrated Circuit), a resistance element, a capacitor, a coil or a frequency oscillator. These electronic components, the antenna 100 and the external electrode are electrically connected to conductive patterns which are formed in the top layer of the substrate 500, in inner layers of the substrate 500 and in a layer on the back surface, and each have a certain function. In particular, the electronic circuit 200 includes an oscillator circuit (radio communication section) composed of the foregoing electronic components, and transmits/receives radio wave using the antenna 100. Note that the phrase that the antenna 100 transmits/receives radio wave includes both of a case where the antenna 100 performs only either one of transmitting or receiving radio wave and a case where the antenna 100 performs both of transmitting or receiving radio wave.

The conductive pattern is composed of wiring, an electrode provided on one end of the wiring, a pad connected to vias or through holes provided on the other end of the wiring. As for the electrode and the wiring, the pattern of them are formed by etching. And, vias or through holes are opened by methods such as etching, a laser, machining or the like. Inside these holes, conductive material are disposed. These holes may be fully-filled or may have films formed on inner walls of these holes.

The resin layer 300 will be described below. As shown in FIG. 1, the resin layer 300 covers the electronic circuit 200 in the first circuit region 501, specifically speaking it covers the foregoing electronic components. In particular, a part covered with the shielding layer 400 is composed of five flat surfaces because the surface of the resin layer 300 is processed by a dicing blade of a dicing apparatus (to be described later). The resin layer 300 is formed by methods such as potting, printing, transfer molding or the like; in this embodiment, used is a printing method in which a silk mask or a metal mask is employed.

The shielding layer 400 will be described below. In order to cover the resin layer 300 composed of five surfaces, the shielding layer 400 is also composed of five surfaces, namely a front surface and four walls. As shown in FIG. 1, the shielding layer 400 includes: a partition wall 401 provided between the first circuit region 501 and the first antenna region 503; a short-side wall 402 opposite to the partition wall 401; a pair of long-side walls 403 and 404 connecting the partition wall 401 and the short-side wall 402; and a surface 405 covering a region surrounded by these walls 401 to 404 on the surface of the resin layer 300. The wall on the near side of the module 1000 in FIG. 1 is defined as the long-side wall 403.

The antenna 100 is composed of a conductive pattern formed in the second antenna region 504 (the second region)

on the back surface of the substrate 500 (the other face). FIG. 2 shows how the antenna 100 is formed in the second antenna region 504.

The electronic circuit 200 and the antenna 100 are electrically connected via an antenna connection portion 100A (not shown). The antenna connection portion 100A connects the electronic circuit 200 and the antenna 100 by a conductive pattern provided in the substrate 500. The antenna 100 may be directly connected to the antenna connection portion 100A which is composed of a conductive pattern in an inner layer of the substrate 500 on the first circuit region 501 side. Or, the antenna 100 may be indirectly connected to the antenna connection portion 100A as follows: the antenna 100 is connected to an electrode of a motherboard (not shown) and the electrode is connected to the antenna connection portion 100A, which is composed of a conductive pattern in an inner layer of the substrate 500 on the first circuit region 501 side.

The antenna 100 has been formed simultaneously with an external connection electrode (not shown) in the second circuit region 502, and is a Cu pattern generally.

Back to FIG. 1, the resin layer 300 is formed in only the first circuit region 501 to seal the electronic circuit 200 which is mounted on the front surface of the substrate 500 (the one face). The resin layer 300 may be formed throughout the first circuit region 501, or may be formed only in a portion of the first circuit region 501 where the electronic circuit 200 is mounted. The resin layer 300 is made of, for example, UV-curable resin or thermosetting resin such as epoxy resin. A method for forming the resin layer 300 will be described later.

The shielding layer 400 is formed by applying a conductive paste on the surface of the resin layer 300 and thereafter curing it; the conductive paste is a paste in which a powder of metal such as Au, Ag and Ni is densely dispersed in thermosetting resin or UV-curable resin and having conductivity. In this embodiment, Ag paste is used as an example. Forming the shielding layer 400 can also be realized by methods such as plating or sputtering, and in a case of sputtering, used is Cu or SUS/Cu/SUS, or the like.

As mentioned above, the electronic circuit 200 is sealed with the resin layer 300, and thereafter, the surface of the resin layer 300 is covered with the shielding layer 400 having conductivity. Accordingly, without using a metal case, it is possible to reduce leakage of noise generated by the electronic circuit 200. This makes it possible to downsize the wireless module 1000.

It is sufficient that the shielding layer 400 is formed on a surface of the resin layer 300, and is located at a position where the layer 400 can suppress leakage of noise generated from the electronic circuit 200. But, the wireless module 1000 according to an embodiment of the present disclosure is formed so that the shielding layer 400 covers the entire surface of the resin layer 300, as shown in FIG. 1. This configuration makes it possible to more securely prevent noise leakage from the electronic circuit 200. Accordingly, the capability of the antenna 100 can be further improved.

As shown in FIGS. 3A to 3E, the wireless module 1000 according to an embodiment of the present disclosure is configured so that, inside the short-side wall 402 indicated by symbol L1, the shielding layer 400 is electrically connected to a ground layer 510 located inside the substrate 500.

The symbol L1 indicates one end face of the wireless module 1000, and the symbol L3 indicates the other end face of the wireless module 1000. The symbol L2 indicates the boundary between the first circuit region 501 and the first antenna region 503.

As shown in FIGS. 3A to 3E, in the wireless module 1000 according to an embodiment of the present disclosure, on the boundary L2 between the first circuit region 501 and the first antenna region 503, the shielding layer 400 does not reach to the substrate 500 and some parts of the resin layer 300 are exposed. Instead thereof, a shield 520 for shielding noise is provided in the substrate 500. The detail thereof will be described later, and with such a configuration, when forming the shielding layer 400, shielding can be realized without forming grooves in the substrate 500. This makes it possible to avoid decreasing the strength of the wireless module 1000.

FIGS. 3A to 3E and 4A to 4F illustrate five examples of the concrete configuration of the shield 520. The substrates 500 shown in FIGS. 3A to 3E each are a multi-layer substrate in which conductive patterns are formed on top and back surfaces of its core layer. And below described are five types of the substrates classified depending on the form of the shield 520. It is acceptable that there is no conductive pattern on the back surface of the substrate 500. The substrate 500 is a resin substrate, a ceramic substrate, or a semiconductor substrate as mentioned above, and it is sufficient that the substrate can be employed as a common interposer substrate. Since the shield 520 is made of metal, it is preferable that the shield 520 is grounded to GND. But, a concrete structure for grounding is omitted.

Figure 3A:
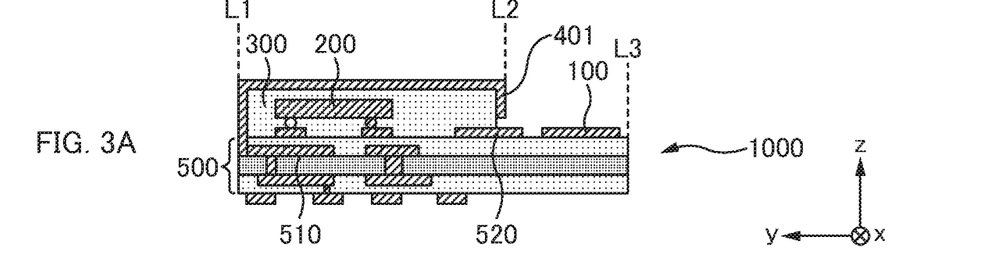
FIG. 3A is a cross-sectional view of a wireless module according to an embodiment of the present disclosure.

First, the wireless module 1000 shown in FIG. 3A is a type of wireless module in which the antenna 100 is located on the top side of the substrate 500 and in which the resin layer 300 on the antenna 100 is removed. But, the resin layer 300 may be provided on the antenna 100. The shield 520 is composed of a flat, shielding pattern, and straddles between the first circuit region 501 and the first antenna region 503 below the partition wall 401.

Figure 4A:
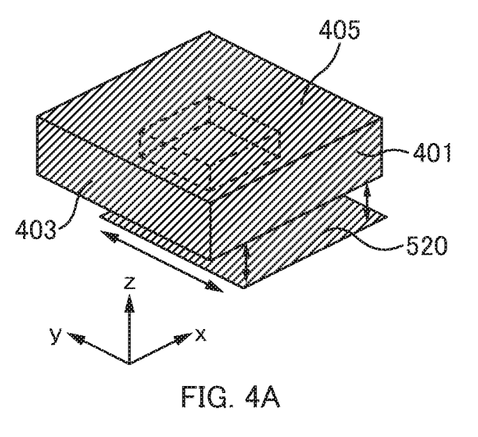
FIG. 4A is a diagram illustrating a shielding structure of a wireless module according to an embodiment of the present disclosure.

The spread of the shield 520 in FIG. 3A is shown in FIG. 4A. The width of the shield 520 in x direction is substantially the same as or slightly smaller than that of the partition wall 401. In the example of FIG. 4A, the width of the shield 520 in x direction is smaller than the width of the partition wall 401. The shield 520 spreads in y direction from the partition wall 401 to the first circuit region 501 and to the first antenna region 503, and straddles between two regions 501 and 503.

In such a configuration, it is possible to shield the antenna 100 from noise entering from the electronic circuit 200, in particular, noise entering obliquely into the antenna 100 from the IC.

Figure 3B:
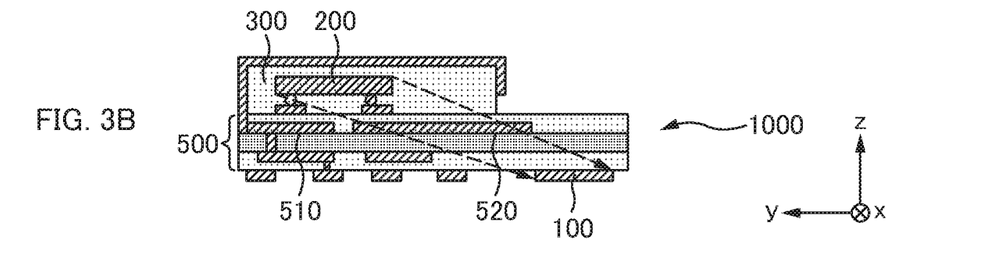
FIG. 3B is a cross-sectional view of a wireless module according to an embodiment of the present disclosure.

Next, the wireless module 1000 shown in FIG. 3B is a type of wireless module in which the antenna 100 is located on the back side of the substrate 500 and in which the resin layer 300 on the antenna 100 is removed. In similar to FIG. 3A, the shield 520 is composed of a flat, shielding pattern, and straddles between the first circuit region 501 and the first antenna region 503 below the partition wall 401.

Figure 4B:
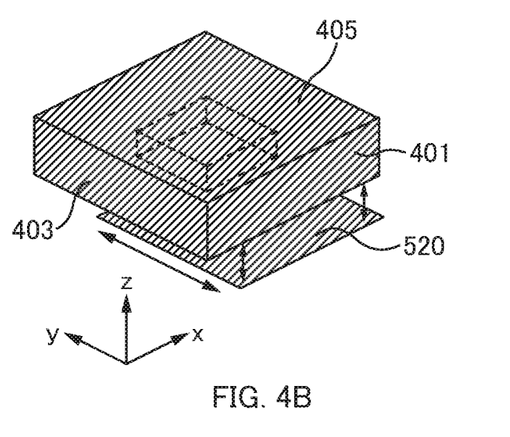
FIG. 4B is a diagram illustrating a shielding structure of a wireless module according to an embodiment of the present disclosure.

The spread of the shield 520 in FIG. 3B is shown in FIG. 4B. In x direction, the width of the shield 520 shown in FIG. 4B is substantially the same as or slightly smaller than that of the partition wall 401. The shield 520 spreads in y direction from the partition wall 401 to the first circuit region 501 and to the first antenna region 503, and straddles between two regions 501 and 503. The shield 520 spreads, in the first circuit region 501, to at least a side wall of a closer chip on the back surface of the IC. Note that the shielding pattern 520 is arranged so that the distance from the shielding pattern 520 to the front surface of the substrate 500 (the one face) is smaller than the distance from the shielding pattern 520 to the back surface of the substrate 500 (the other face). That is, in the thickness direction of the substrate 500, the closer to the front surface (rather than the core layer or the center) the shielding pattern 520 is arranged, the wider the shielding range is. This makes the shielding effect good.

Figure 3C:
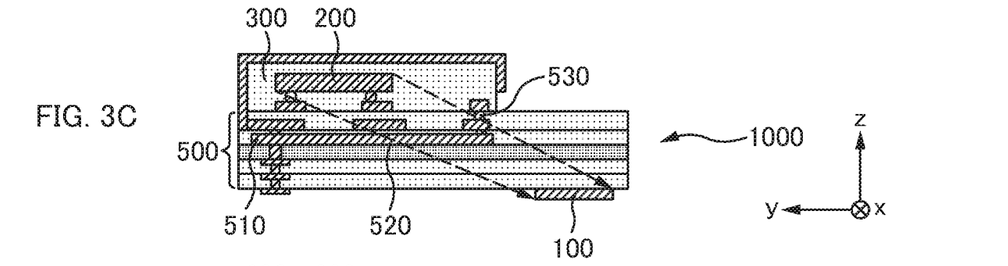
FIG. 3C is a cross-sectional view of a wireless module according to an embodiment of the present disclosure.

Next, the wireless module 1000 shown in FIG. 3C will be described below. This wireless module 1000 is a type of wireless module in which the antenna 100 is located on the back side of the substrate 500 and in which the resin layer 300 on the antenna 100 is removed. But, the resin layer 300 may be provided on the antenna 100. The shield 520 shown in FIG. 3C is composed of a flat, shielding pattern in similar to FIG. 3B. And, the shield 520 shown in FIG. 3C spreads from the partition wall 401 to the back side of the IC within the first circuit region 501. In the shielding pattern 520, a plurality of shielding columns 530 are provided. The shielding columns 530 extend to the front surface of the substrate 500.

Figure 4C:
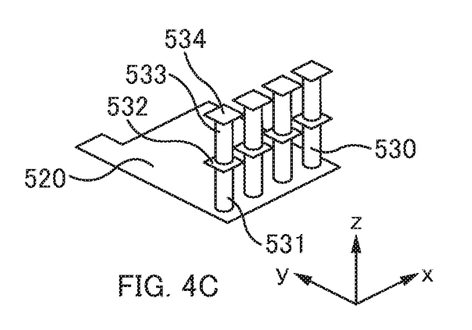
FIG. 4C is a diagram illustrating a shielding structure of a wireless module according to an embodiment of the present disclosure.

FIG. 4C shows the configuration of the shielding pattern 520. The component indicated by symbol 520 is a GND layer located above an insulation layer formed in a layer upper than the core layer of the substrate 500, and is also a shielding pattern. The components indicated by symbols 531 and 533 are vias in a layer upper than the GND layer 520, and the components indicated by symbols 532 and 534 are pads disposed above/below the vias 531 and 533. That is, the configuration is as follow: the vias 531 and 533 are provided through the insulation layer, and are filled inside with plating material; and a lower electrode and an upper electrode are electrically connected to each other.

The spacing between two conductive columns (shielding columns) 530 adjacent to each other is a spacing to shield from noise. The plurality of shielding columns 530 are formed with the spacing in x direction so as to be disposed from the one end of the partition wall 401 to the other end. In the wireless module 1000 shown in FIG. 3C, the horizontal plane (xy plane) is shielded by the shielding pattern 520, and the shield in the vertical direction (z direction) is realized by the plurality of shielding columns 530 lined in x direction.

Figure 3D:
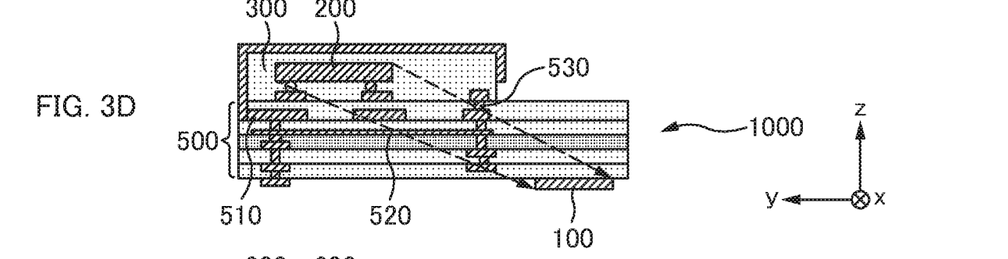
FIG. 3D is a cross-sectional view of a wireless module according to an embodiment of the present disclosure.

Next, the wireless module 1000 shown in FIG. 3D will be described. This wireless module 1000 is a type of wireless module in which the antenna 100 is located on the back side of the substrate 500 and in which the resin layer 300 on the antenna 100 is removed. But, the resin layer 300 may be provided on the antenna 100. In similar to FIG. 3C, the shield 520 shown in FIG. 3D is composed of a flat, shielding pattern, and spreads from the partition wall 401 to the back side of the IC within the first circuit region 501. On both surfaces of the shielding pattern 520, a plurality of shielding columns 530 are provided. The shielding columns 530 extend respectively to the front surface and the back surface of the substrate 500.

Figure 4D:
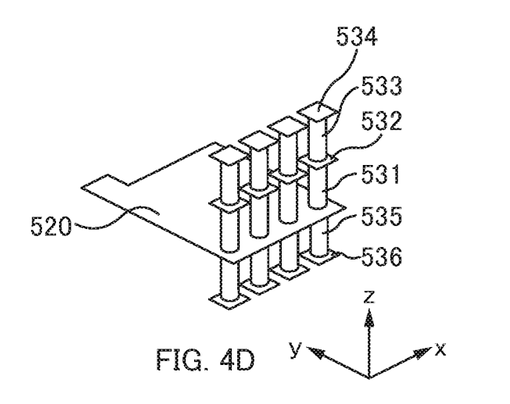
FIG. 4D is a diagram illustrating a shielding structure of a wireless module according to an embodiment of the present disclosure.

FIG. 4D shows the configuration of the shielding pattern 520. The component indicated by symbol 520 is a GND layer located above an insulation layer formed in a layer upper than the core layer of the substrate 500, and is also a shielding pattern. The components indicated by symbols 531 and 533 are vias in a layer upper than the GND layer 520, and the component indicated by symbol 535 is a via in a layer lower than the GND layer 520.

The components indicated by symbols 532, 534 and 536 are pads disposed above/below the vias. The spacing between two conductive columns (shielding columns) 530 adjacent to each other is a spacing to shield from noise, in similar to the shielding columns 530 shown in FIG. 4C. The plurality of shielding columns 530 are formed with the spacing in x direction so as to be disposed from the one end of the partition wall 401 to the other end.

Compared to the shielding column 530 shown in FIG. 4C, in a case of the shielding column 530 shown in FIG. 4D, conductive walls are formed in the substrate 500, not only above the shield 520 but also below the shield 520. This makes the shielding effect better.

Figure 3E:
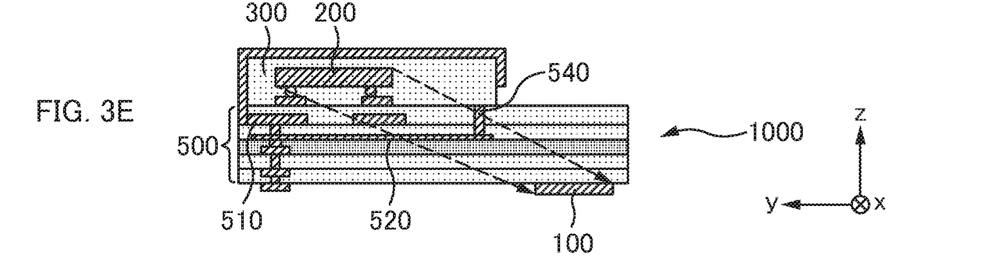
FIG. 3E is a cross-sectional view of a wireless module according to an embodiment of the present disclosure.
Figure 4E:
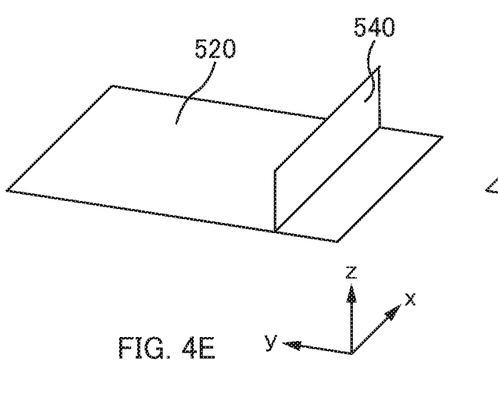
FIG. 4E is a diagram illustrating a shielding structure of a wireless module according to an embodiment of the present disclosure.
Figure 4F:
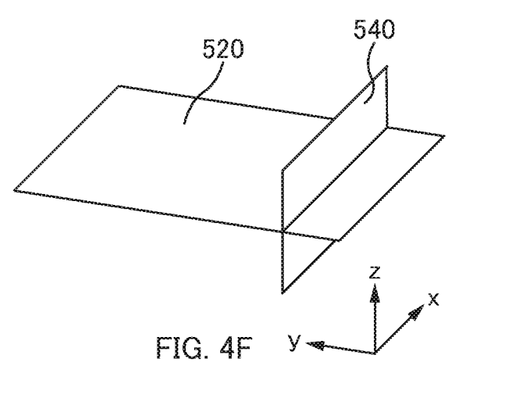
FIG. 4F is a diagram illustrating a shielding structure of a wireless module according to an embodiment of the present disclosure.

The wireless module 1000 shown in FIG. 3E will be described. This wireless module 1000 is a type of wireless module in which the antenna 100 is located on the back side of the substrate 500 and in which the resin layer 300 on the antenna 100 is removed. But, the resin layer 300 may be provided on the antenna 100. In similar to FIG. 3D, the shield 520 shown in FIG. 3E is composed of a flat, shielding pattern, and spreads from the partition wall 401 to the back side of the IC within the first circuit region 501. In the shielding pattern 520, a shielding wall 540 is provided along x direction from the one end of the partition wall 401 to the other end. FIGS. 4E and 4F show the configuration of the shielding wall 540. the shielding wall 540 is formed as follow: a groove of a certain depth is formed along x direction in an insulation layer on the front side or the back side of the substrate 500, and the groove is filled with conductive material. This allows the shielding wall 540 to function like one conductive plate mounted within the substrate 500 in the vertical direction (z direction).

Thus, in particular, in a case where the antenna 100 exists on the back side of the substrate 500, providing the shield 520 in the aforementioned manner is effective because there is noise transferring in the substrate 500 obliquely from the electronic circuit 200 to the antenna 100.

In each of FIGS. 3B to 3E, arrows indicated by dashed lines are described. These dashed lines are vertical lines showing a range in which noise are radiated from the electronic circuit 200 to the antenna 100. That is, taking the IC 200 as an example of a noise source, a range in which noise are radiated is a range surrounded by a first virtual line and a second virtual line; the first virtual line connects an IC end on the short-side wall 402 side and an antenna end on the short-side wall 402 side, and the second virtual line connects an IC end on the partition wall 401 side and an antenna end on a second short-side wall 402A side. Arranging the shielding pattern 520, the shielding columns 530 and the shielding wall 540 within the range between the virtual lines allows them to exhibit their shielding effects.

Since the partition wall 401 does not reach to the substrate 500, it is possible to maintain the strength of the substrate 500. Also, leakage of noise from below the partition wall 401 can be minimized by the shield 520, the shielding column 530 and the shielding wall 540.

Second Embodiment

Method for Manufacturing Wireless Module

Next, with reference to FIGS. 5A to 5J, a method for manufacturing the wireless module 1000 according to an embodiment of the present disclosure will be described below.

The wireless module 1000 according to an embodiment of the present disclosure is manufactured by forming a plurality of the wireless modules 1000 as a unit using a large substrate 500A and subsequently by dicing the wireless modules 1000. In particular, since the antenna 100 is placed on the back surface of the substrate 500, it is preferable that the shielding layer 400 formed on the top side of the substrate 500 is removed as much as possible. In this embodiment, this point will be described.

FIGS. 5A, 5C, 5E, 5G and 5I are cross-sectional views of the large substrates 500A, and FIGS. 5B, 5D, 5F, 5H and 5J are perspective views of the large substrates 500A in which their top sides are visible. The dashed lines L show the first circuit region 501 and the first antenna region 503 of the wireless module 1000; and a single wireless module 1000 includes one electronic circuit 200 and one antenna 100. One wireless module 1000 is defined as one unit. FIGS. 5B, 5D, 5F, 5H and 5J illustrate how the six units are arranged in a 3×2 matrix.

Figure 5A:
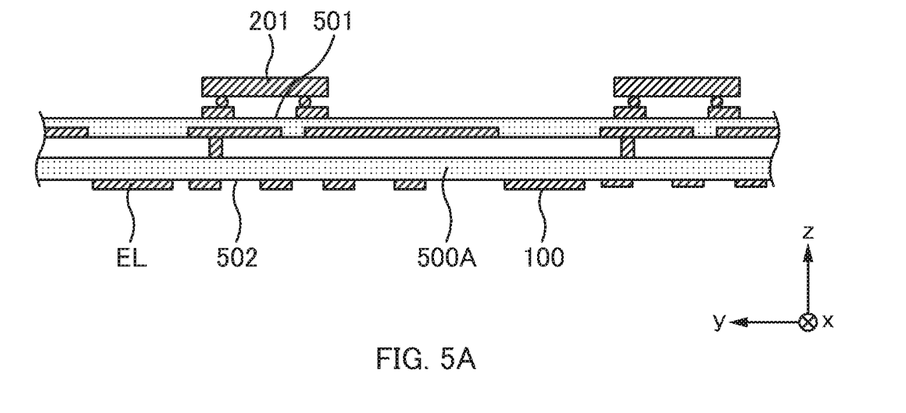
FIG. 5A is a diagram illustrating a method for manufacturing a wireless module according to an embodiment of the present disclosure.
Figure 5B:
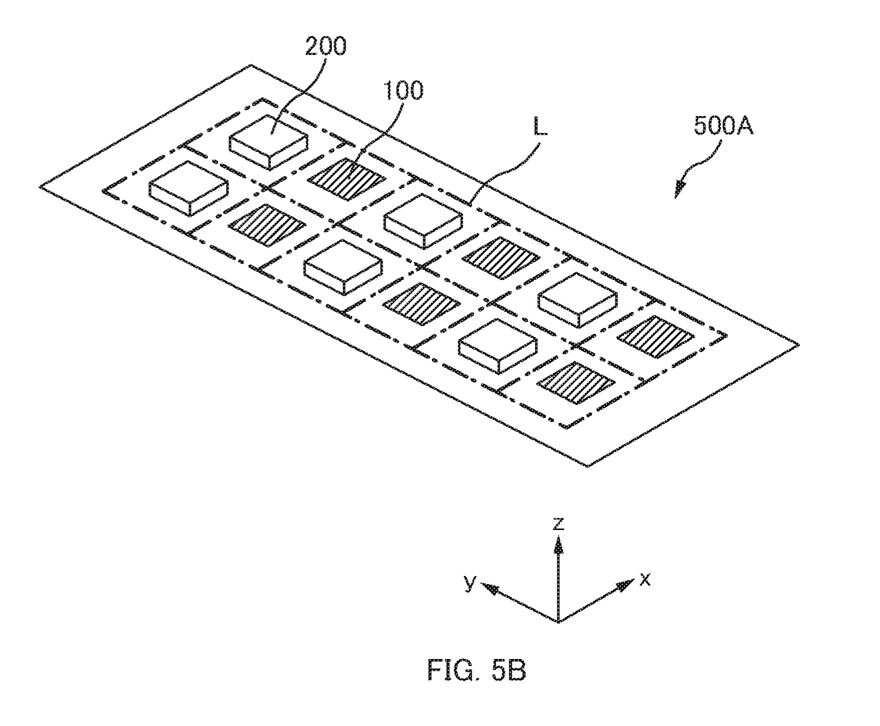
FIG. 5B is a diagram illustrating a method for manufacturing a wireless module according to an embodiment of the present disclosure.

A process for preparing the large substrate 500A is first performed, as shown in FIGS. 5A and 5B.

The large substrate 500A is composed of a ceramic substrate, a semiconductor substrate or a resin substrate as mentioned above. During the process for manufacturing the large substrate 500A, formed are the antenna 100 and conductive patterns in the front surface, inner layers and the back surface.

On the top side of the large substrate 500A, electrodes are provided because electronic components are mounted in the first circuit region 501. In addition, in order to realize desired functions as the wireless module 1000, wirings extending from the electrodes are provided.

On the back side of the large substrate 500A, a plurality of external connection electrodes EL are provided on the second circuit region 502 side. A solder ball, etc. may be mounted on the back side of the large substrate 500A. Redistribution is provided in the external connection electrodes EL, and external connection electrodes EL are arranged periodically. Note that the external connection electrodes EL may be omitted.

Conductive patterns in inner layers of the large substrate 500A will be described below. The number of layers of the conductive patterns in the inner layers is determined according to functions of the wireless module 1000. The conductive patterns in the inner layers are electrically connected to vias or through holes which extend from above or from below, and are also electrically connected to conductive patterns on the front surface or on the back surface mentioned above. The conductive patterns in the inner layers form a certain circuit together with electronic components of the mounted electronic circuit 200.

Accordingly, the antenna 100 is composed of a Cu pattern which has been formed simultaneously with the external connection electrodes EL. Note that components of the antenna 100 may be mounted separately.

The foregoing conductive patterns are each generally composed of an electrode, wiring connected to the electrode, a pad for through holes and vias, and the like. The electrode, the wiring and the pad are realized by patterning film made of metal (e.g. Cu) using ordinary photolithography. The vias and the through holes are formed as follow: holes are made by methods such as etching, laser processing, machining (e.g. drilling), and then the holes are filled or coated inside with metal (Cu in this embodiment) using a plating method.

Thus, the large substrate 500A is prepared. And, since the concrete method thereof is commonly known, the description thereof will be omitted.

After the large substrate 500A is prepared, electronic components necessary for the electronic circuit 200 are mounted onto the large substrate 500 A, and are electrically connected to an electrode for mounting. The electronic components includes a semiconductor device 201 (e.g. an IC), a passive element (e.g. a chip capacitor or a chip resistor), a crystal oscillator or the like. The electronic components are generally sucked by a mounter and are fixed with solder at their own desired positions on the large substrate 500A. (electronic-circuit-mounting step)

Figure 5C:
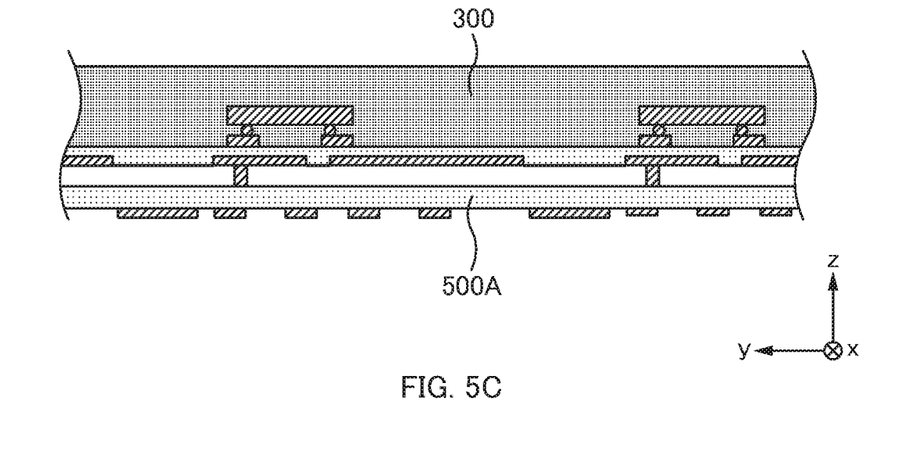
FIG. 5C is a diagram illustrating a method for manufacturing a wireless module according to an embodiment of the present disclosure.
Figure 5D:
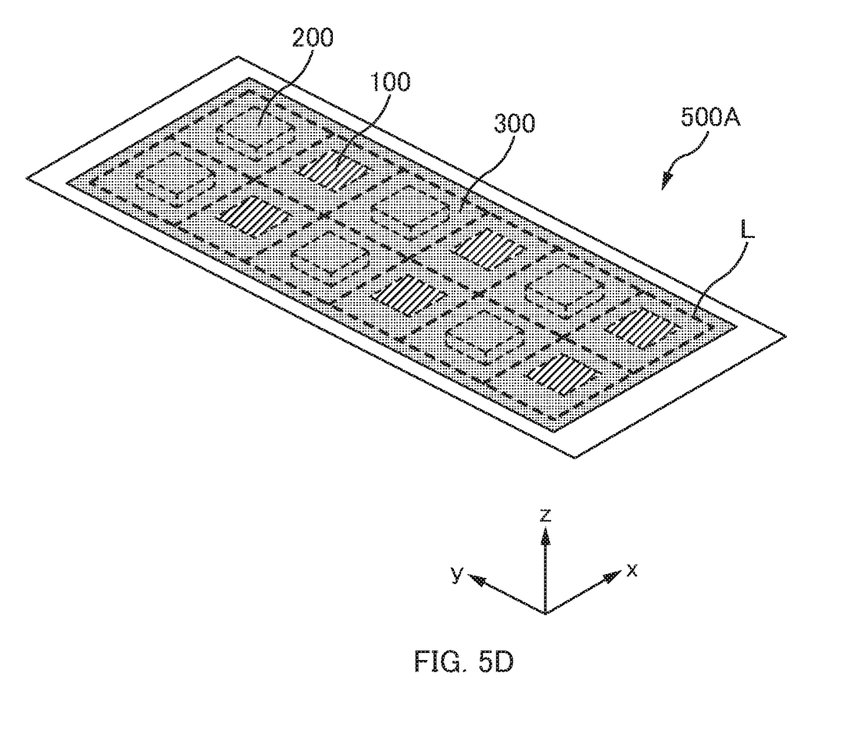
FIG. 5D is a diagram illustrating a method for manufacturing a wireless module according to an embodiment of the present disclosure.

Next, as shown in FIGS. 5C and 5D, the resin layer 300 is formed by covering with resin the entire front surface of the large substrate 500A, thereby to seal the electronic circuit 200 (resin-layer-forming step). Parts indicated by dashed lines L in FIG. 5D are parts to undergo dicing in a subsequent process, and the resin layer 300 is formed one size larger than an area indicated by dashed lines L.

As methods for sealing the electronic circuit 200 with the resin layer 300, there are transfer molding, injection molding, printing, potting and the like. Since the first two methods needs molds, the latter methods are employed in this embodiment.

Printing is a method as follow: applying fluid sealing resin material onto a silk screen or a metal screen, rubbing the sealing resin material with a squeegee, and coating the electronic circuit 200 placed on the large substrate 500A. In potting, fluid resin trickles from above. In any of these methods, a surface will have gentle irregularities because these methods do not use a mold. Accordingly, in these methods, after resin has been cured, is performed a polishing/grinding process for flattening the surface of the resin. Thus, the electronic circuit 200 is sealed.

Figure 5E:
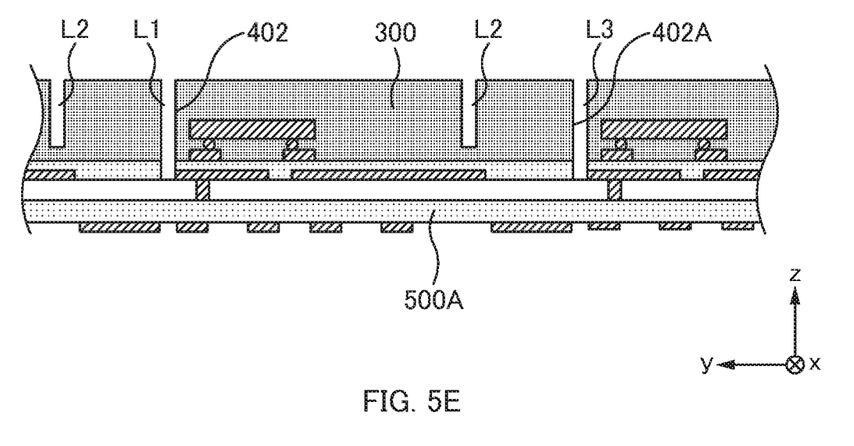
FIG. 5E is a diagram illustrating a method for manufacturing a wireless module according to an embodiment of the present disclosure.
Figure 5F:
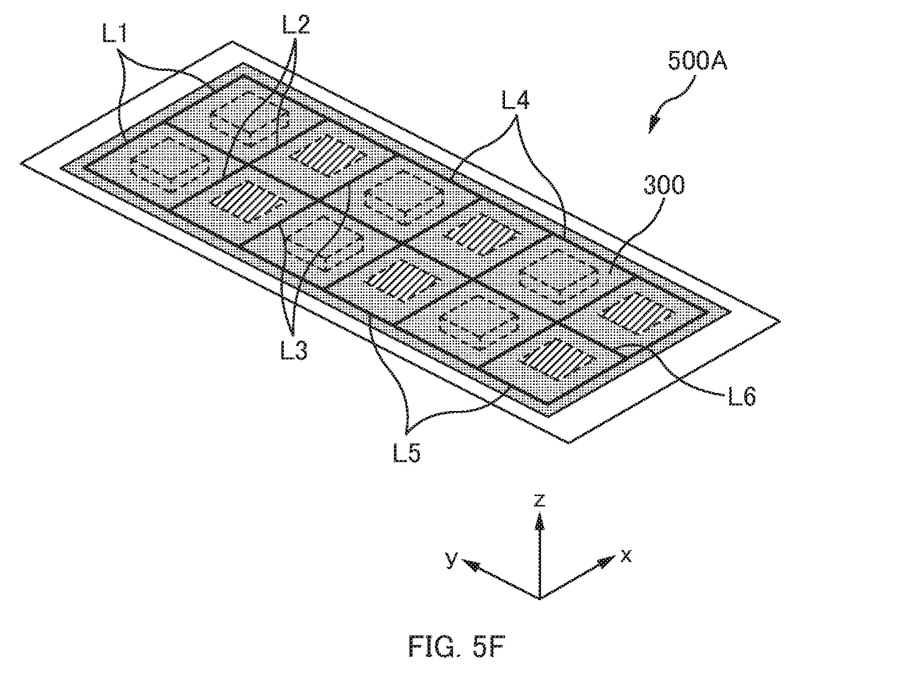
FIG. 5F is a diagram illustrating a method for manufacturing a wireless module according to an embodiment of the present disclosure.

Next, as shown in FIGS. 5E and 5F, a process for forming grooves are performed. In particular, in order for the shielding layer 400 to form the partition wall 401, the short-side wall 402 and the long-side walls 403 and 404, grooves are formed as follow (the grooves is indicated by symbols L1 to L6).

Regarding dicing in x direction, half-cut dicing is performed up to an inner layer of the large substrate 500A along the line L1 (corresponding to the short-side wall 402) in order to expose a GND line 510 on the inner layer of the large substrate 500A.

Subsequently, half-cut dicing is performed up to middle of the resin layer 300 along the line L2 (corresponding to the partition wall 401). In similar to the line L1, half-cut dicing is performed up to the inner layer of the substrate 500 along the line L3 (corresponding to short-side wall 402A). By repeating the foregoing processes, dicing in x direction is performed.

Regarding dicing in y direction, in similar to the line L2, half-cut dicing is performed up to middle of the resin layer 300 along the lines L4, L5 and L6. Note that the depths of grooves L2, L4, L5 and L6 are important in the subsequent processes.

Figure 5G:
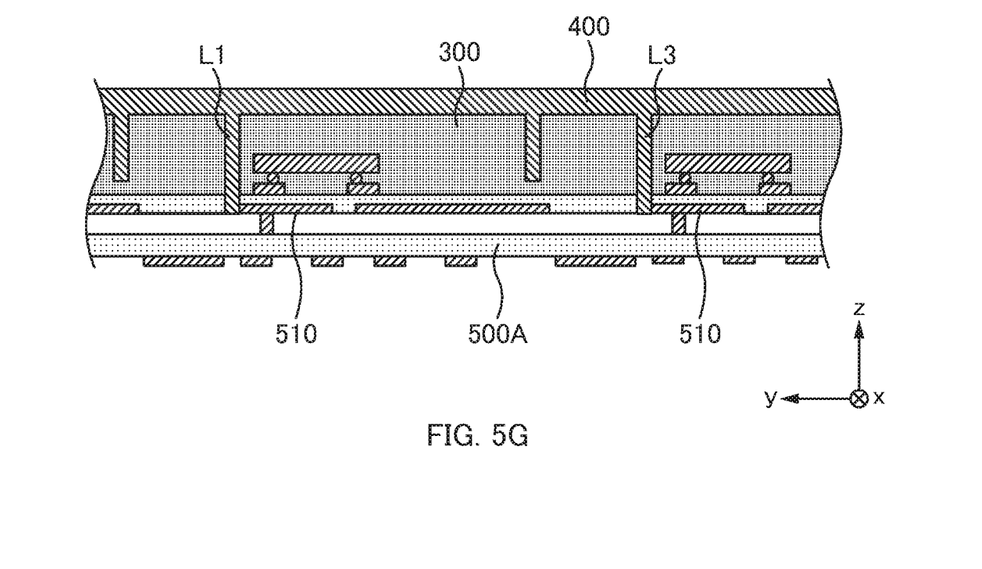
FIG. 5G is a diagram illustrating a method for manufacturing a wireless module according to an embodiment of the present disclosure.
Figure 5H:
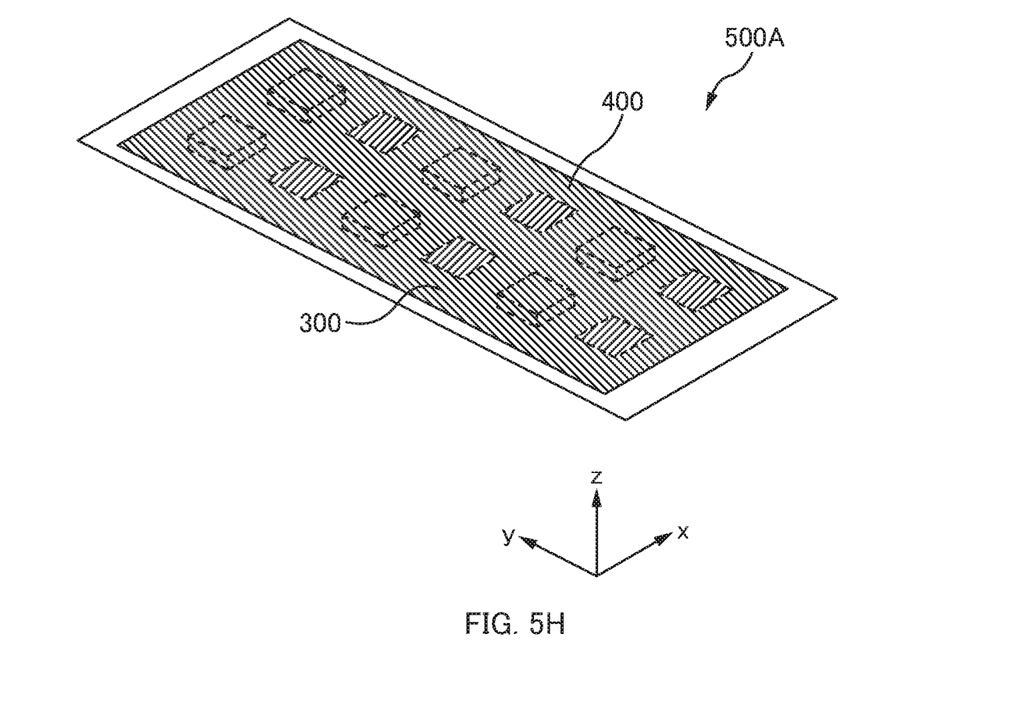
FIG. 5H is a diagram illustrating a method for manufacturing a wireless module according to an embodiment of the present disclosure.

As shown in FIGS. 5G and 5H, conductive material is provided on the surface of the resin layer 300 and inside the grooves L1 to L6, to form the shielding layer 400 (shielding-layer-forming step).

Here, parts of the shielding layer 400 which are formed inside the grooves L1 and L3 are electrically connected to the ground layer MO in the inner layer of the substrate 500A.

As methods for forming the shielding layer 400, there are printing of conductive paste, spin-on formulation, plating by quenching in liquid, sputtering which is one of vacuum coating formation, and the like.

A conductive paste used in a method such as printing and spinning on is a paste in which a powder of at least one metal selected from a group of Ag, Au, Pt and Cu is contained in softened resin. In similar to printing used for forming the resin layer 300, printing used for forming the shielding layer 400 is a method as follow: applying fluid conductive resin onto a silk screen or a metal screen, rubbing it with a squeegee, and coating the resin layer 300. A method of spinning on is as follow: after applying to the resin layer 300 a conductive paste having a viscosity slightly lower than that of a conductive paste used in printing, the large substrate 500A is rotated, and the centrifugal force of the rotation causes the conductive paste to spread the surface of the resin layer 300, to coat the surface with the paste. In the foregoing two methods, the conductive paste which is softened is applied to the surface of the resin layer 300, and is cured after the entire resin layer 300 is coated by printing or rotation of the large substrate 500A.

In plating method, for example, the large substrate 500A is immersed in a plating bath of Cu or the like, to coat the surface of the resin layer 300. In a case of plating, the resin layer 300 is coated by electroless plating or electroplating. In sputtering method, the large substrate 500A is placed in a vacuum chamber, to coat the surface of the resin layer 300 with sputtered metal. For example, Cu sputtering (coating with copper), two-layer sputtering of SUS/Cu (coating with stainless steel and copper) and three-layer sputtering of SUS/Cu/SUS may be employed.

with these conductive materials, the insides of the grooves and the surface of the resin layer 300 is coated, to form the shielding layer 400.

Figure 5I:
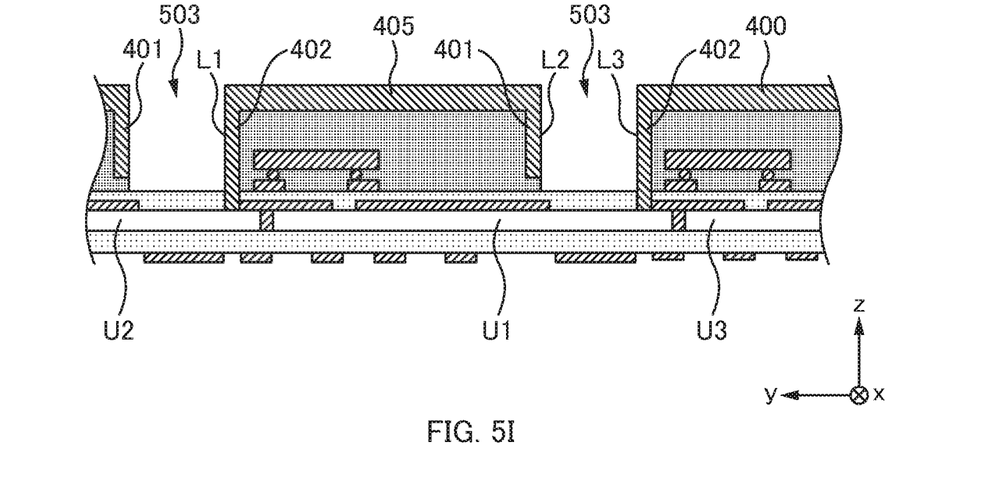
FIG. 5I is a diagram illustrating a method for manufacturing a wireless module according to an embodiment of the present disclosure.
Figure 5J:
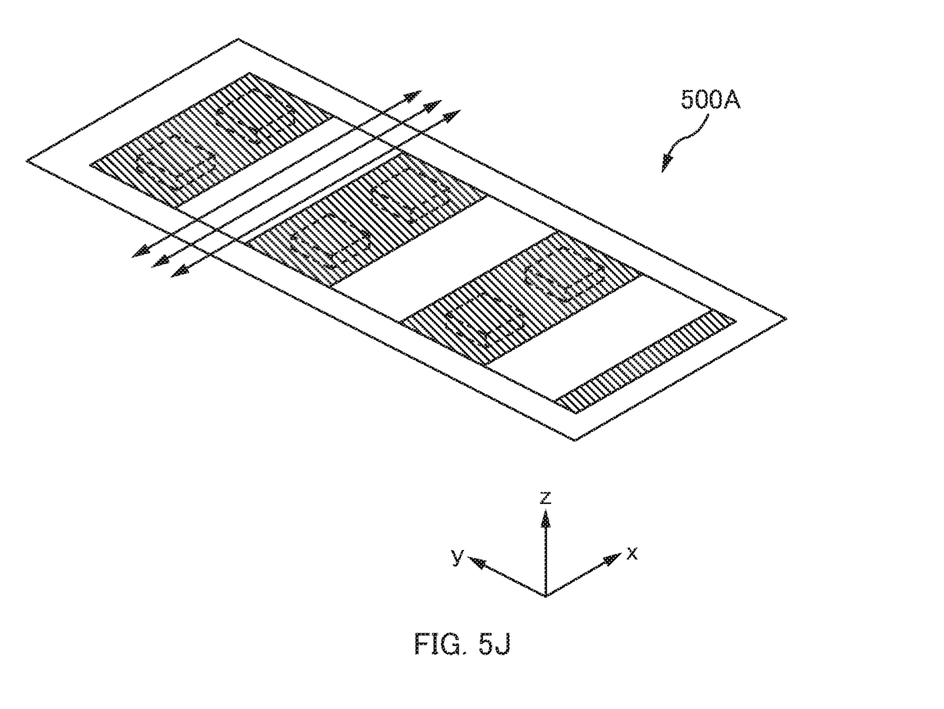
FIG. 5J is a diagram illustrating a method for manufacturing a wireless module according to an embodiment of the present disclosure.

Subsequently, as shown in FIGS. 5I and 5J, the resin layer 300 and the shielding layer 400 which are formed in the first antenna region 503 are removed by cutting using a polishing/grinding apparatus (removing step).

In a case of the large substrate 500A shown in FIG. 5J, polished/ground are together the resin layer 300 and the shielding layer 400 in each first antenna region 503 of two units arranged in line in x direction. A direction for polish/grinding is x direction.

Specifically, focusing on unit U1 shown in the FIG. 5I, the resin layer 300 and the shielding layer 400 are ground so that the shielding layer 400 remains as the partition wall 401 of the left-adjacent unit U2, the short-side wall 402 of the unit U1, the partition wall 401 of the unit U1 and the short-side wall 402 of the right-adjacent unit U3. The grinding is performed by a dicing apparatus. A dicing blade mounted on the dicing apparatus moves back and forth a several times in a direction of the arrows shown in FIG. 5J (x direction); thereby the grinding is performed.

When forming grooves on lines L2, L4, L5 and L6 shown in FIG. 5F, half-cut dicing is performed so that each groove is formed up to a depth which does not reach the large substrate 500A. At the bottom of each groove, the resin layer 300 is exposed and left between the bottom of the groove and the front surface of the substrate 500. Accordingly, since the bottom of the groove is a lower part of the shielding layer 400 in the first antenna region 503, stopping polishing/grinding between the lower part of the shielding layer 400 and the substrate 500A makes it possible to remove all the shielding layer 400 in the first antenna region 503.

In this embodiment, all the grooves L2, L4, L5 and L6 formed by half-cut dicing have the same depth. However, the depth of the grooves L2, L4, L5 and L6 may be different as long as the resin layer 300 is left between the bottom of each groove and the front surface of the substrate 500A. Thus, stopping polishing/grinding between the bottom of the deepest groove and the front surface of the substrate 500A makes it possible to remove cleanly the shielding layer 400.

If the depths of the grooves is larger than the thickness of the resin layer 300, it is conventionally necessary to form the grooves in the substrate 500 and this decreases the strength of the substrate 500. However, in this embodiment, it is possible to maintain the strength of the substrate 500.

In a conventional method for manufacturing using the large substrate 500A, since the antenna 100 and the electronic circuit 200 are sealed together, their covering has a thickness to cover tall components of the electronic circuit 200. Whereas the electronic circuit 200 has a certain height, the antenna 100 is configured in form of a thin conductive pattern and has only a little height. Accordingly, the amount of resin coating the antenna 100 part is greater than the amount of resin coating the electronic circuit 200 part. This causes significant difference in amount of resin between on the electronic circuit 200 and on the antenna 100, and unfortunately leads to cambers of the substrate 500 after dicing the large substrate 500A. However, in this embodiment, grinding the resin layer 300 can be performed simultaneously with removal of the shielding layer 400 in the antenna 100 part, and this makes it possible to reduce the amount of resin shrinkage on the antenna 100 side. Accordingly, cambers of the substrate 500 can be suppressed.

Next, as mentioned above, there is a process in which the large substrate 500A undergoes full-cut dicing and in which each of the wireless modules 1000 undergoes dicing. The large substrate 500A is subject to full-cutting along lines L1, L3, L4, L5 and L6 shown in FIG. 5F. Here, the large substrate 500A is cut so that the four side surfaces 401, 402, 403 and 404 of the shielding layer 400 remain. Thus, finished is the wireless module 1000 according to an embodiment of the present disclosure.

The configuration of the wireless module 1000 according to an embodiment of the present disclosure and the method for manufacturing the same are described above. In the wireless module 1000 in which the antenna 100 and the electronic circuit 200 are mounted to the substrate 500 and which is sealed with resin, the configuration and the method according to an embodiment of the present disclosure make it possible to shield noise caused by the electronic circuit 200, without decreasing the strength of the substrate 500.

For example, in removing process, when removing by cutting the resin layer 300 and the shielding layer 400 which are formed in the first antenna region 503, it is acceptable that a thin resin layer 300 of a certain thickness remain without completely removing the resin layer 300 from the front surface of the substrate 500.

What is claimed is:

1. A wireless module, comprising: a substrate; an electronic circuit mounted in a first region on a one face of the substrate; a conductive pattern formed in a second region on another face of the substrate, the conductive pattern being connected to a radio communication section of the electronic circuit, and the conductive pattern serving as an antenna when transmitting/receiving radio wave, the second region being different from the first region; a resin layer sealing the electronic circuit in the first region; a shielding layer formed on a surface of the resin layer, the shielding layer not intersecting any of virtual straight lines that connect the electronic circuit to the conductive pattern, representing possible noise passages from the electronic circuit to the conductive pattern; and a shield disposed in either one of a top layer of the substrate and an inner layer of the substrate, the shield being for shielding noise radiated from the electronic circuit wherein the shield is configured and located at such a position that the shield intersects substantially all of the virtual straight lines that connect the electronic circuit to the conductive pattern, thereby blocking the possible noise passages from the electronic circuit to the conductive pattern.

2. The wireless module according to claim 1, wherein:
the shielding layer formed on the resin layer includes:
a partition wall provided between the first region and the second region;
a short-side wall opposite to the partition wall;

a pair of a first long-side wall and a second long-side wall connecting the partition wall and the short-side wall; and a front surface covering a region surrounded by the four side walls, and the shield includes: a flat, shielding pattern, the shielding pattern being provided on either one of the top layer of the substrate and an inner layer of the substrate located on a side closer to the top layer, the shielding pattern straddling between the first region and the second region in a layer below the partition wall, the shielding pattern being present under the partition wall.

3. The wireless module according to claim 1, wherein:

the shielding layer formed on the resin layer includes:

a partition wall provided between the first region and the second region;

a short-side wall opposite to the partition wall;

a pair of a first long-side wall and a second long-side wall connecting the partition wall and the short-side wall; and a front surface covering a region surrounded by the four side walls, and the shield includes: a plurality of shielding columns, the plurality of shielding columns being provided from the top layer of the substrate toward a back surface of the substrate, the plurality of shielding columns being provided either directly below of the partition wall or at a position adjacent to below the partition wall.

4. The wireless module according to claim 1, wherein:

the shielding layer formed on the resin layer includes:

a partition wall provided between the first region and the second region;

a short-side wall opposite to the partition wall;

a pair of a first long-side wall and a second long-side wall connecting the partition wall and the short-side wall; and a front surface covering a region surrounded by the four side walls, and the shield includes: a shielding wall, the shielding wall being provided from the top layer of the substrate toward a back surface of the substrate, the shielding wall being provided either directly below the partition wall or at a position adjacent to below the partition wall.

5. The wireless module according to claim 2, wherein the shielding pattern is provided in a layer where a distance from the layer to the one face of the substrate is smaller than a minimum distance from the layer to the other face of the substrate.

6. The wireless module according to claim 3, wherein the shielding columns are composed of conductive material provided in either one of a via of the substrate and a through hole of the substrate.

7. The wireless module according to claim 4, wherein the shielding wall is composed of conductive material provided in a groove of the substrate.

8. The wireless module according to claim 1, wherein the electronic circuit does not overlap with the conductive pattern in a plan view.

9. The wireless module according to claim 8, wherein all of the virtual straight lines connecting the electronic circuit to the conductive pattern are oblique lines angled with respect to a horizontal plane that is parallel to the top layer of the substrate.

10. The wireless module according to claim 9, wherein the shield includes a flat, shielding pattern, and the shielding pattern is provided on either one of the top layer of the substrate and an inner layer of the substrate located on a side closer to the top layer.

11. The wireless module according to claim 1, wherein:

the shielding layer formed on the resin layer includes:

a partition wall provided between the first region and the second region, the partition wall not reaching the top layer of the substrate;

a short-side wall opposite to the partition wall;

a pair of a first long-side wall and a second long-side wall connecting the partition wall and the short-side wall; and a front surface covering a region surrounded by the four side walls, and the shield includes: a flat, shielding pattern and one of a shielding wall and a plurality of shielding columns that is upwardly extending from the shielding pattern, the shielding pattern being provided in an inner layer of the substrate, said one of the shielding wall and the plurality of shielding columns being located directly below the partition wall or at a position adjacent to below the partition wall, and the shielding pattern and said one of the shielding wall and the plurality of shielding column collectively intersecting substantially all of the virtual straight lines that connect the electronic circuit to the conductive pattern, thereby blocking the possible noise passages from the electronic circuit to the conductive pattern.

* * * * *